US006810058B2

(12) United States Patent
Wesstrom (10) Patent No.: US 6,810,058 B2
(45) Date of Patent: Oct. 26, 2004

(54) SEMICONDUCTOR LASER WITH GAIN WAVEGUIDE LAYER PROVIDING TRANSVERSAL AND LONGITUDINAL MODE STABILITY

(75) Inventor: Jan Olof Wesstrom, Stockholm (SE)

(73) Assignee: ADC Telecommunications, Inc., Eden Praire, MN (US)

(*) Notice: Subject to any disclaimer, the term of this patent is extended or adjusted under 35 U.S.C. 154(b) by 23 days.

(21) Appl. No.: 10/128,538

(22) Filed: Apr. 23, 2002

(65) Prior Publication Data

US 2003/0198269 A1 Oct. 23, 2003

(51) Int. Cl.[7] .................................................. H01S 5/00
(52) U.S. Cl. ........................... 372/50; 372/20; 372/43; 372/44; 372/45; 372/46; 372/47; 372/48; 372/49; 372/99; 372/102
(58) Field of Search ............................... 372/20, 43–50, 372/99, 102

(56) References Cited

U.S. PATENT DOCUMENTS

| | | | | |
|---|---|---|---|---|
| 4,689,797 A | | 8/1987 | Olshansky | 372/45 |
| 4,870,649 A | * | 9/1989 | Bobeck et al. | 372/19 |
| 4,942,585 A | | 7/1990 | Ungar et al. | 372/44 |
| 4,946,802 A | | 8/1990 | Shima et al. | 437/129 |
| 5,231,642 A | * | 7/1993 | Scifres et al. | 372/45 |
| 5,292,685 A | * | 3/1994 | Inoguchi et al. | 438/32 |
| 5,321,714 A | | 6/1994 | Paoli | 372/50 |
| 5,499,261 A | | 3/1996 | Welch et al. | 372/50 |
| 5,537,432 A | | 7/1996 | Mehuys | 372/50 |
| 5,539,571 A | | 7/1996 | Welch et al. | 359/344 |
| 5,586,131 A | * | 12/1996 | Ono et al. | 372/19 |
| 5,621,828 A | | 4/1997 | Baets et al. | 385/14 |
| 5,793,521 A | | 8/1998 | O'Brien et al. | 359/344 |
| 5,841,799 A | * | 11/1998 | Hiroki | 372/19 |
| 6,014,396 A | | 1/2000 | Osinski et al. | 372/46 |
| 6,022,671 A | * | 2/2000 | Binkley et al. | 430/321 |
| 6,081,361 A | * | 6/2000 | Adams et al. | 398/201 |
| 6,396,854 B1 | * | 5/2002 | Takagi | 372/20 |

OTHER PUBLICATIONS

Jayaraman, V., et al., "Widely tunable continous–wave InGaAsP/InP sampled grating lasers", *Electronics Letters*, 30(18), (1994), pp. 1492–1494.

Rigole, P., et al., "114–nm Wavelength Tuning Range of Vertical Grating Assisted Codirectional Coupler Laser with a Super Structure Grating Distributed Bragg Reflector", *IEEE Photonics Technology Letters*, 7(7), (1995), pp. 697–699.

Saavedra, A., et al., "Amplitude and Frequency Modulation Characteristics of Widely Tunable GCSR Lasers", *IEEE Photonics Letters*, 10(10), (1998), pp. 1383–1385.

Saavedra, A., et al., "Relative Intensity Noise and Linewidth Measurements of a Widely Tunable GCSR Laser", *IEEE Photonics Technology Letters*, 10(4), (1998), pp. 481–483.

* cited by examiner

Primary Examiner—Don Wong
Assistant Examiner—Delma R. Flores Ruiz
(74) Attorney, Agent, or Firm—Schwegman, Lundberg, Woessner & Kluth, P.A.

(57) ABSTRACT

A high-power semiconductor laser with a gain waveguide layer tailored to provide transverse and lateral mode stability is disclosed. The gain waveguide layer has a width that varies in proportion to the power distribution within the layer. Narrow sections of the gain waveguide layer provide transversal stability by filtering out higher order modes, while the wide sections reduce the average four-wave mixing and the resultant longitudinal modal instabilities.

25 Claims, 6 Drawing Sheets

SEMICONDUCTOR LASER WITH GAIN WAVEGUIDE LAYER PROVIDING TRANSVERSAL AND LONGITUDINAL MODE STABILITY

FIELD OF THE INVENTION

The present invention relates to lasers, and in particular to high-power semiconductor lasers having transversal and longitudinal mode stability.

BACKGROUND OF THE INVENTION

Semiconductor lasers have great utility for a wide variety of applications, particularly optical communications. There are a variety of semiconductor laser structures (e.g., double heterostructure, buried heterostructure, ridge waveguide, etc.), as well as a variety of semiconductor laser geometries, such as distributed feedback or "DFB," distributed Bragg reflector or "DBR," grooved coupled-cavity or "GCC," and "grating coupler sampled reflector" or "GCSR." Fundamental to such lasers structures and geometries is that lasing is made possible by a solid-state gain medium being arranged within a resonant cavity.

Semiconductor lasers can lase in multiple cavity modes in both the transverse and longitudinal directions with frequencies where the gain medium has gain larger than the losses. A spectral filter that selects a single frequency (or narrow frequency band) can be used to ensure single-mode lasing. For example, in a DBR laser, the spectral filter includes a Bragg grating tuned to reflect the desired frequency. In a grating coupler sampled reflector (GCSR) laser, the spectral filter is made up of two elements: a sampled reflector that produces a series of reflector peaks, and a coupler that selects one of the peaks.

It is often preferred that a semiconductor laser provide the highest output power possible. However, this can result in high power densities in the gain medium that can induce non-linear effects (e.g., four-wave mixing), which in turn can induce lasing in longitudinal (i.e., spatial) modes other than the preferred longitudinal mode. This tends to limit the amount of power obtainable from the laser, particularly from a single transverse mode laser, which needs to have a small waveguide width to maintain transversal stability. The small waveguide width makes the power density high even for rather modest output powers, which induces the non-linear effects.

Accordingly, what is needed is a semiconductor laser that provides high output power in a single lateral mode without creating large power densities in the gain medium to ensure longitudinal and transverse mode stability of the laser.

SUMMARY OF THE INVENTION

A high-power semiconductor laser with a gain waveguide layer tailored to provide transverse and lateral mode stability is disclosed. Narrow sections of the gain waveguide layer provide transversal stability by filtering out higher-order modes, while the wide sections reduce the average four-wave mixing and the resultant longitudinal modal instabilities. Thus, the whole laser does not need to be narrow to avoid transversal instability.

In one example embodiment of the invention, the semiconductor laser includes a tuning section with a waveguide layer having a first width. The laser also includes a gain section with a gain waveguide layer. The gain waveguide layer has a front facet and a rear end that define a laser cavity. The gain section is coupled to the waveguide layer of the tuning section at the rear end to form a joint to the tuning section. The gain waveguide layer is formed on a mesa between a layer of n-doped indium phosphide (n-InP) and a layer of p-doped indium phosphide (p-InP). The gain waveguide layer has a varying power distribution, and the width of the gain waveguide layer varies in correspondence with the varying distribution. The gain waveguide layer matches the width of the tuning section waveguide layer at the joint to the tuning section, and has a select width at the front facet.

Another example embodiment of the invention is a laser module. The laser module includes a semiconductor laser having a tuning section coupled to a gain section. The tuning section includes a phase section and a reflector section, and a waveguide layer having a first width. The gain section has a gain layer with front facet and a rear end that define a laser cavity. The gain layer is coupled to the waveguide layer of the tuning section at the rear end to form a joint to the tuning section. In an example embodiment, the gain layer is formed on a mesa between a layer of n-doped indium phosphide (n-InP) and a layer of p-doped indium phosphide (p-InP). The gain layer supports a varying power distribution. The width of the gain waveguide layer varies in correspondence with the distribution of power, and matches the width of the tuning section waveguide layer at the joint to the tuning section. The module further includes first, second and third current sources electrically connected to the gain section, phase section and reflector section, respectively. A programmable controller is connected to the first, second and third current sources and is programmed to control the current sources to deliver select amounts of current to the respective sections of the laser.

DETAILED DESCRIPTION OF THE INVENTION

In the following detailed description of the embodiments of the invention, reference is made to the accompanying drawings that form a part hereof, and in which is shown by way of illustration specific embodiments in which the invention may be practiced. These embodiments are described in sufficient detail to enable those skilled in the art to practice the invention, and it is to be understood that other embodiments may be utilized and that changes may be made without departing from the scope of the invention. The following detailed description is, therefore, not to be taken in a limiting sense, and the scope of the present invention is defined only by the appended claims.

Figure 1A:
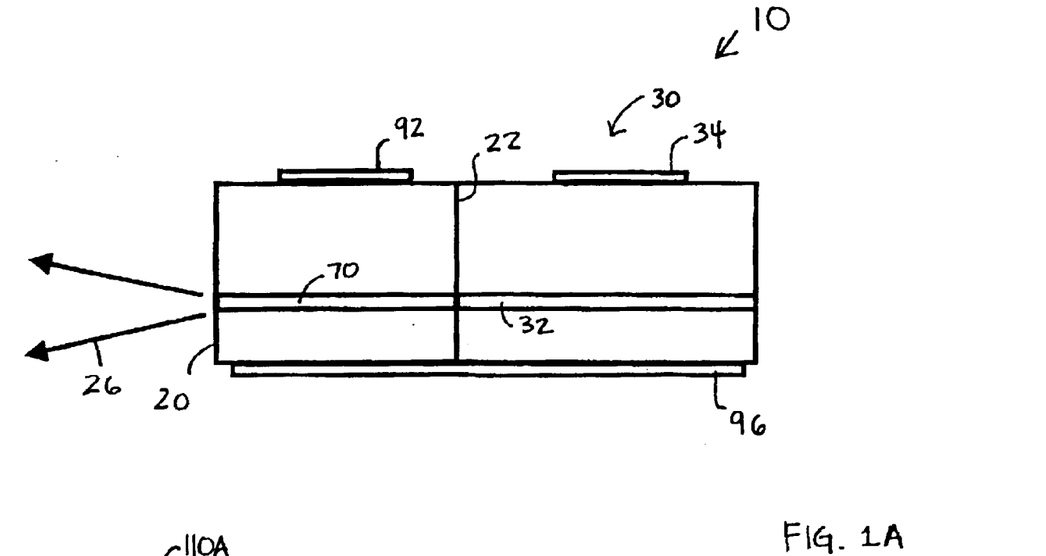
FIG. 1A is a side view of a semiconductor laser showing the gain section coupled to a tuning section.

With reference to FIG. 1A, there is shown a semiconductor laser 10 that includes a gain section 14 with front facet 20 and opposite end 22. An output beam 26 emitted from the front facet. Interfaced with the gain section at end 22 is a tuning section 30 with a waveguide layer 32. Accordingly, rear end 22 is also referred herein as "joint 22 to the tuning section." Tuning section has a lower surface 34.

The gain section provides light amplification for lasing, while the tuning section tunes the lasing frequency. The precise structure of the tuning section depends on the type of laser. Several types of semiconductor lasers and their tuning sections are discussed in greater detail below.

Figure 1B:
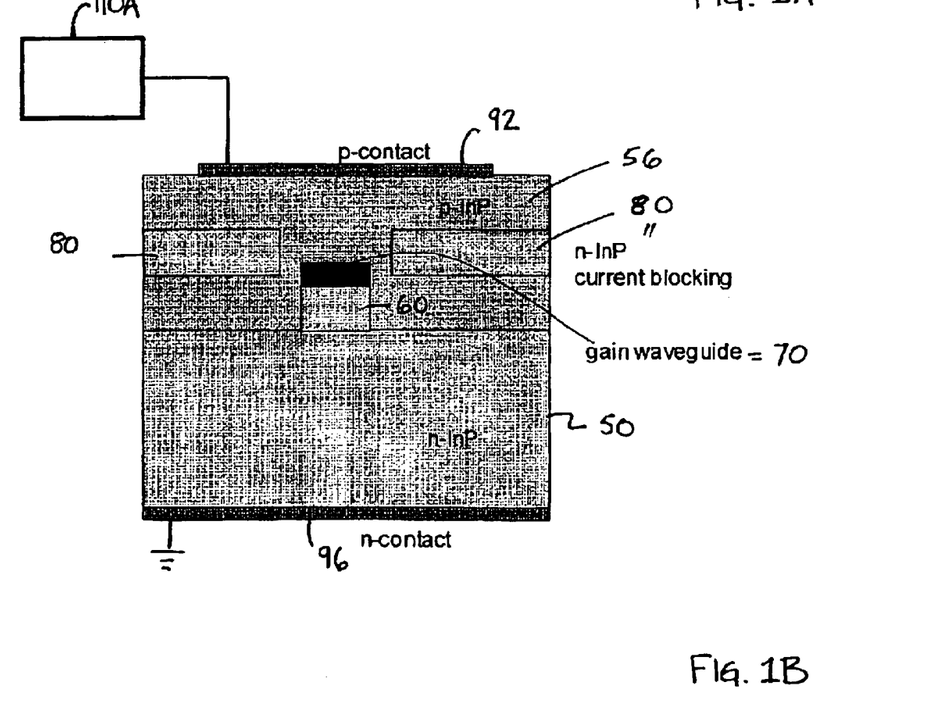
FIG. 1B is a cross-sectional view of the gain section of the laser of FIG. 1A showing the gain waveguide layer, the current-blocking segments and the current source connected to the upper contact.

With reference to FIG. 1B, gain section 14 further includes an n-InP layer 50 upon which is formed a p-InP layer 56. The n-InP layer includes a mesa 60 that extends upward into the p-InP layer. A gain waveguide layer 70 is formed as part of mesa 60. In one example embodiment, the gain waveguide layer is formed from bulk InGaAsP material with a bandgap close to the photon energy. In another example embodiment, the gain waveguide layer is formed from multiple quantum wells sandwiched between separate confinement layers (not shown). The gain waveguide layer is coupled to waveguide layer 32 of tuning section 30.

Gain section 14 further includes current-blocking segments 80 of n-InP formed in p-InP layer 56 that form a gap above gain waveguide layer 70. Atop p-InP layer 56 is formed an upper p-contact 92 made of metal. Likewise, on the bottom of n-InP layer 50 is formed an n-contact 96 made of metal that extends over lower surface 34 of tuning section 30. The p-contact is connected to a current source 110A and the n-contact is connected to ground. Current source 110 provides the injection current to pump gain waveguide layer 70, while current-blocking segments 80 serve to direct the current to the gain waveguide layer. The tuning sections are similar to the gain section in that they also have current blocking layers and current sources, as discussed in greater detail below.

Gain waveguide layer 70 is designed to provide high output power while maintaining transverse mode stability and ensuring single transverse mode output. Front facet 20 may include an antireflection coating AR to increase the output power. The gain waveguide layer design is based on mitigating the aforementioned non-linear effects that reduce the laser output power while also maintaining transverse mode stability. The design depends on the power distribution within the gain waveguide layer, which in turn depends on the type of laser.

Four different examples of lasers to which the present invention is applicable are now described in greater detail. Then, procedures for designing the gain waveguide layers for the example lasers is set forth. The design procedures are applicable to all semiconductor lasers having a non-uniform distribution of power within the gain waveguide layer.

DBR Laser

Figure 2:
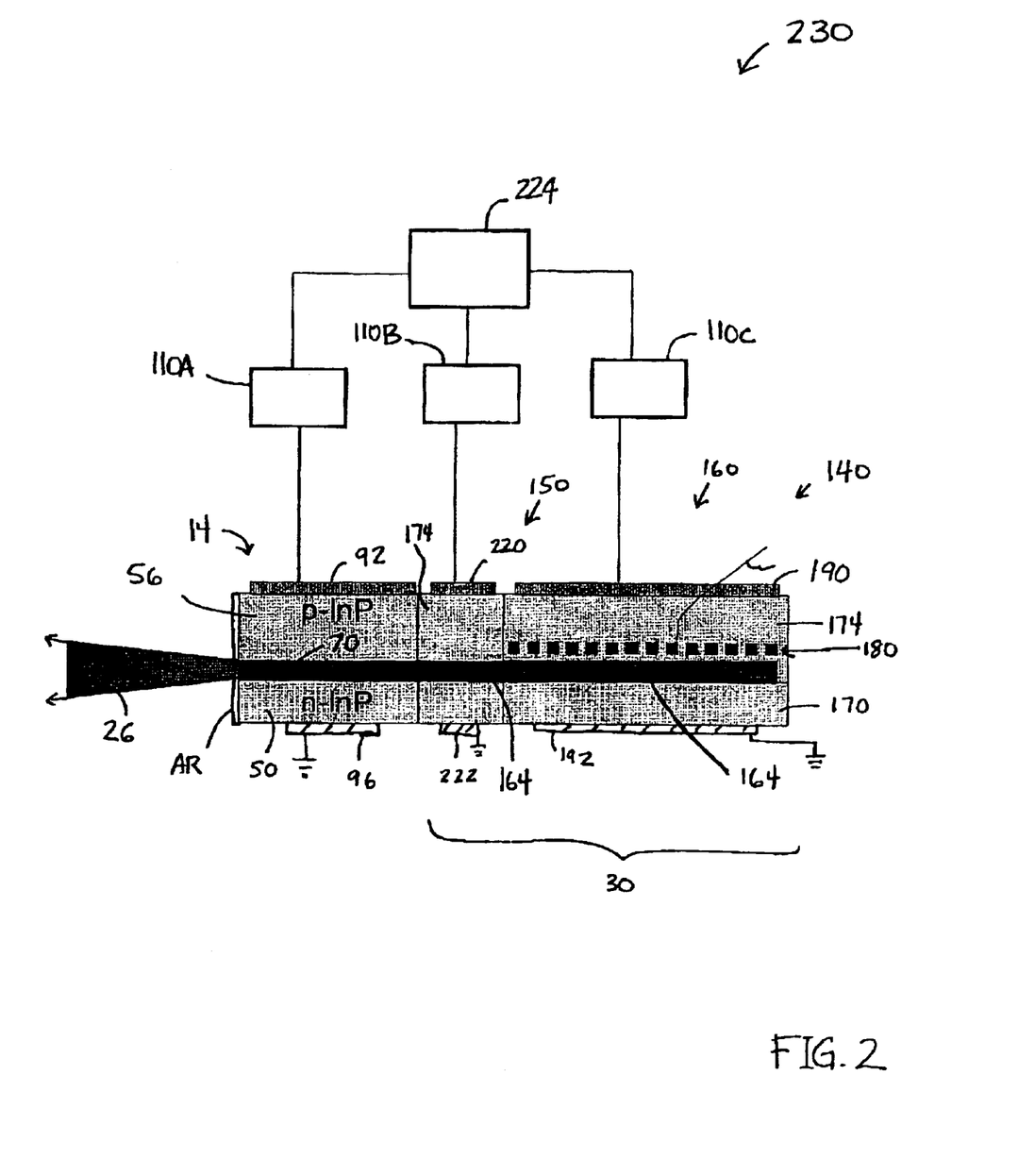
FIG. 2 is a side view of a DBR laser having a tuning section that includes an optional phase section and a reflector section with a periodic grating reflector.

With reference to FIG. 2, there is shown an example DBR laser 140 that includes gain section 14 and tuning section 30. The latter includes, in the example embodiment shown, a phase section 150 and a reflector section 160. In another example embodiment, the tuning section does not include the phase section so that the reflector section is interfaced directly to the gain section.

The reflector section 160 includes, in an example embodiment, an InGaAsP tunable waveguide layer 164 sandwiched between an n-InP layer 170 and a p-InP layer 174. Included in the p-InP layer just above waveguide layer 164 is a periodic reflector grating 180. In an example embodiment, the periodic grating reflector grating is formed from InGaAsP. The reflector grating reflects frequencies over a small bandwidth corresponding to the periodicity of the grating, thereby serving to select a single cavity mode for lasing. The reflection frequency is shifted ("tuned") by introducing a current into the reflector section via upper and lower contacts 190 and 192, with the upper contact connected to a current source 110B. The carriers injected into waveguide layer 164 by the current changes the refractive index of the layer, which changes the reflected frequency.

Phase section 150 serves to fine-tune the position of the cavity modes so that one (longitudinal) cavity mode aligns with the reflector peak for optimal single-mode lasing conditions. The phase section can be considered an extension of the reflection section but without the periodic grating. The phase section includes upper and lower contacts 220 and 222, with the upper contact connected to current source 110C. The fine-tuning of the position of the cavity modes is accomplished by applying a current to the contacts and changing the refractive index of the portion of waveguide layer 164 within the phase section.

A programmable controller 224 is connected to current source 110A, 110B and 110C. In an example embodiment, the controller includes a look associates the current values supplied by the current sources with a desired output power and frequency. In an example embodiment, programmable controller 224 is a microprocessor.

The laser 140, current sources 110A, 110B and 110C, and programmable controller 224 constitute an integrated laser module 230. In an example embodiment of the laser module 230, lower contacts 192 and 222 associated with the reflector and phase sections form a single grounded contact (i.e., contact 96 extends to the reflector and phase sections).

In an example embodiment without antireflection coating AR, the output power of laser 140 is about 20 mW, while in an example embodiment with antireflection coating AR, the output power is about 30 mW. Further in an example embodiment, the output wavelength ranges anywhere from 1.5 microns to 1.62 microns.

GCSR Laser

Figure 3A:
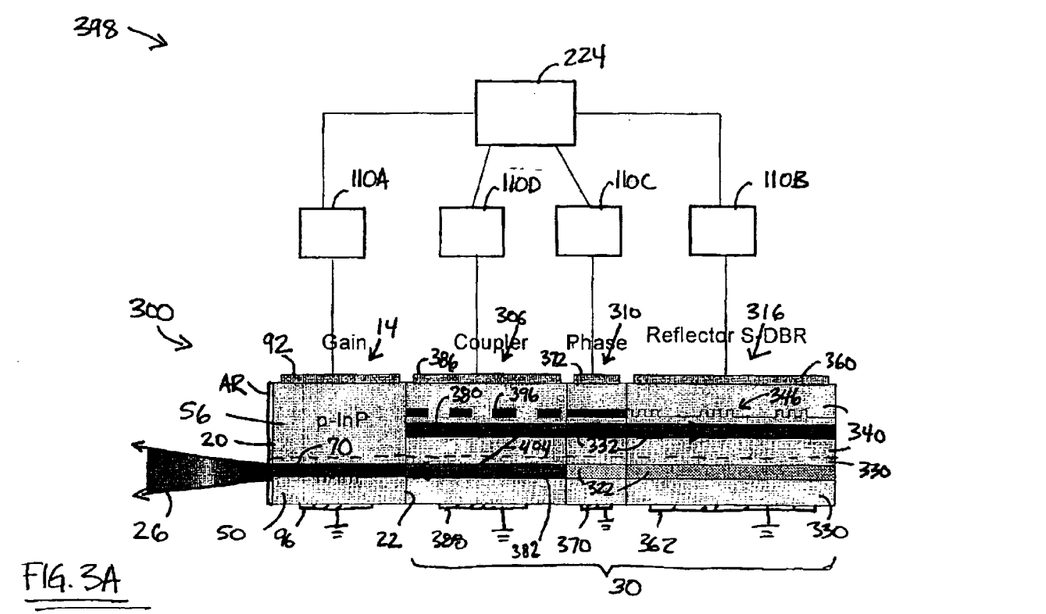
FIG. 3A is a side view of a GCSR laser having a tuning section that includes a coupler section, an optional phase section, and a reflector section with a segmented grating reflector.

With reference to FIG. 3A, there is shown a GCSR laser 300 that includes gain section 10 and tuning section 30, wherein the latter includes a coupler section ("coupler") 306, an optional phase section 310, and a reflector section 316. Gain section is connected to current source 110A.

Reflector section 316 is similar to reflector section 160 of DBR laser 140, except that it includes a lower waveguide 322 within an n-InP section 330, and an upper waveguide 334 within an overlying p-InP section 340. The lower waveguide is laterally unbounded so that any light not coupled to upper waveguide 340 by the coupler disperses and cannot be reflected back to the coupler.

Figure 3B:
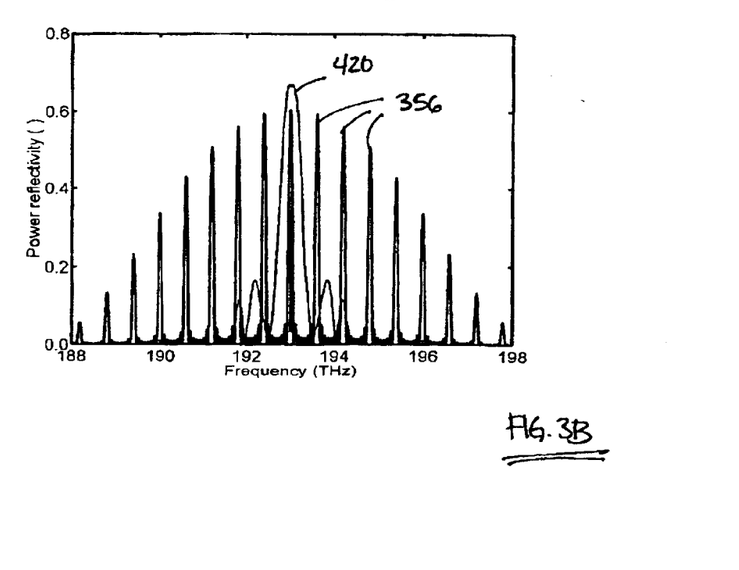
FIG. 3B is a plot of the power reflectivity (arbitrary units) vs. frequency (THz) of the segmented grating reflector of the laser of FIG. 3A, along with the filter function associated with the coupler section that selects a specific frequency range.

Reflection section 316 further includes a sampled reflector grating 346 above the upper waveguide layer. A uniformly periodic reflector grating such as grating 180 of DBR laser 140 can only be tuned by 1–2 THz, which is a fairly narrow tuning range for telecommunication applications. On the other hand, sampled reflector grating 346 results in the formation of multiple reflection peaks 356 over a fairly wide frequency range (typically, 5–20 THz), such as shown in FIG. 3B. The reflector section further includes upper and lower contacts 360 and 362, with the upper contact connected to current source 110B.

Phase section 310 is similar to phase section 110 and serves the same purpose, namely to align one cavity mode with the reflector peak. Phase section 310 is essentially an extension of the reflector section but without the sampled reflector grating 346. Phase section 310 has its own upper and lower contacts 370 and 372, with the upper contact connected to current source 110C.

Coupler section 306 includes upper and lower waveguide layers 380 and 382, and upper and lower contacts 386 and 388. The upper contact is connected to a current source 110D. The lower waveguide layer is coupled at one end to gain waveguide layer 70 and at the other end to lower waveguide 322 of phase section 306 (or reflector section 316). The upper waveguide 334 terminates at one end at the gain section, while the other end is coupled to upper waveguide layer 332 of the phase section (or of the reflection section). In one embodiment, a grating 396 is formed over the upper waveguide layer and serves to enhance the coupling effect between the waveguides. In an example embodiment, the upper and lower waveguide layers 380 and 382 are formed from InGaAsP, with the upper waveguide layer having photoluminescence wavelength of about 1.38 microns, and the lower waveguide having a photoluminescence wavelength of about 1.3 microns.

Coupler section 306 serves as a frequency filter by coupling light 404 of a select frequency range between upper and lower waveguide layers 380 and 382. As illustrated in FIG. 3B, a select multiple reflection peak 356 (e.g., the central peak) associated with a limited frequency range is selected by a filter function 420 defined by the coupler section geometry.

As with the DBR laser 140 described above, a programmable controller 224 is connected to current sources 110A, 110B, 110C and 110D. In an example embodiment, the controller includes a look-up table that associates the current values supplied by the current sources with a desired output power and frequency. In an example embodiment, programmable controller 224 is a microprocessor. The laser 140, current sources 110A, 110B, 110C and 110D, and programmable controller 224 constitute an integrated laser module 398. In an example embodiment of the laser module 398, lower contacts 362, 370 and 388 associated with the reflector, phase and coupler sections are formed as a single grounded contact.

In an example embodiment without antireflection coating AR, the output power of laser 30 is anywhere from about 5 to 10 mW, while in an example embodiment with antireflection coating AR, the output power is anywhere from 10 to 20 mW. Further in an example embodiment, the output wavelength ranges anywhere from 1.5 microns to 1.62 microns.

Design of the Gain Waveguide Layer

The gain waveguide layer is tailored to provide transverse and longitudinal mode stability while also assuring a high output power. Generally, narrow sections of the gain waveguide layer provide transversal stability by filtering out higher order transversal modes, while the wide sections reduce the average four-wave mixing and the resultant longitudinal modal instabilities. However, the narrow and wide sections cannot be arbitrarily placed, since the power distribution in the gain waveguide layer varies.

In designing the gain waveguide layer, one approach is to make the layer narrow where the power is low and to make the layer wide where the power is high. By limiting the length of the wide section, the risk for transversal instabilities is reduced, while the average intensity is reduced by spreading the power out over a wider area.

Another approach, which may be combined with the above approach, is to introduce transversal mode filters in to gain waveguide layer. Such filters are designed to efficiently convert higher order transverse modes arising from through transversal mode instability into radiation modes, thereby leaving just a single mode. Such tailoring of the gain waveguide layer allows for a high output power that would not otherwise be possible in a laser having a uniformly wide or uniformly narrow gain waveguide layer, or having a waveguide layer that does not account for the variation in power within the layer.

To properly tailor the gain waveguide layer, knowledge of the power distribution in the layer is required. The average intensity $I_A$ in the gain waveguide layer is defined as:

$$I_{av} = \frac{1}{L}\int_0^L I\,dz,$$

wherein L is the length of the gain waveguide layer, and z is the direction along the gain waveguide layer. In a given cross-section of the gain waveguide layer, the intensity I can be written as:

$$I = \Gamma P/A$$

wherein P is the power in the cross-section, $\Gamma$ is the confinement factor of the gain waveguide layer, and A is the cross-sectional area.

The above equations indicate that altering the geometry of the laser—in particular, varying the width of the gain waveguide layer—is one way to increase its output power. However, a relatively wide laser has the disadvantage of transverse mode instability, wherein a large number of transversal modes are supported. Such instability is undesirable in a single-mode semiconductor laser.

Thus, the gain waveguide layer is designed with a varying width that varies in proportion to the power distribution, i.e., it has narrow sections where there is relatively low power and wide sections where there is relatively high power. The narrow sections provide transverse mode stability by filtering out the higher-order transverse modes, while the wide sections reduce the average intensity $I_A$, thereby mitigating the four-wave mixing and consequent mode instabilities. A constraint on the varying width of the gain waveguide layer is that it have a select width at the front facet 20 to achieve a tight output beam. A further constraint is that the rear end 22 (i.e., at the joint 22 to the tuning section) have a width that matches the waveguide layer in the tuning section.

To determine the appropriate variation in width of the gain waveguide layer, the optical power distribution in the layer needs to be determined. The location of the optical power minimum in the gain waveguide layer can be calculated using the relationship $$Zmin = L * ln(R_1)/(ln(R_1) + ln(R_2)),$$

wherein Zmin is the distance from front facet 20 to the power minimum, L is the overall length of the gain waveguide layer, R1 is the reflectivity of the front facet, and R2 is the combined reflectivity of the tuning sections 30.

Table 1 below summarizes the power distribution for a DBR laser, an AR-coated DBR laser, a GCSR laser, and an AR-coated GCSR laser. In Table 1, the following parameters are used:

$P_M$=the minimum power along the gain waveguide layer;
$P_1$, $P_2$=powers inside the gain section at the front and back of the gain waveguide layer, respectively;
$P_{AV}$=the average power along the gain waveguide layer;
$P_O$=the output power from the front facet of the laser; and
Zmin/L=the location of the minimum power normalized to the overall length L of the gain waveguide layer.

TABLE 1

Summary of power distribution for 4 different laser types

| LASER TYPE | R1 | R2 | Zmin/L | $P_1/P_M$ | $P_2/P_M$ | $P_{av}/P_M$ | $P_O/P_M$ |
|---|---|---|---|---|---|---|---|
| DBR | 0.3 | 0.7 | 0.77 | 1.19 | 1.02 | 1.05 | 0.64 |
| AR DBR | 0.01 | 0.7 | 0.93 | 5.05 | 1.02 | 2.07 | 4.95 |
| GCSR | 0.3 | 0.03 | 0.26 | 1.19 | 2.97 | 1.46 | 0.64 |
| AR GCSR | 0.01 | 0.03 | 0.57 | 5.05 | 2.97 | 1.91 | 4.95 |

The design of the gain waveguide layer for the example lasers of Table 1 is now discussed below.

DBR Laser without Antireflection Coating

Figure 4:
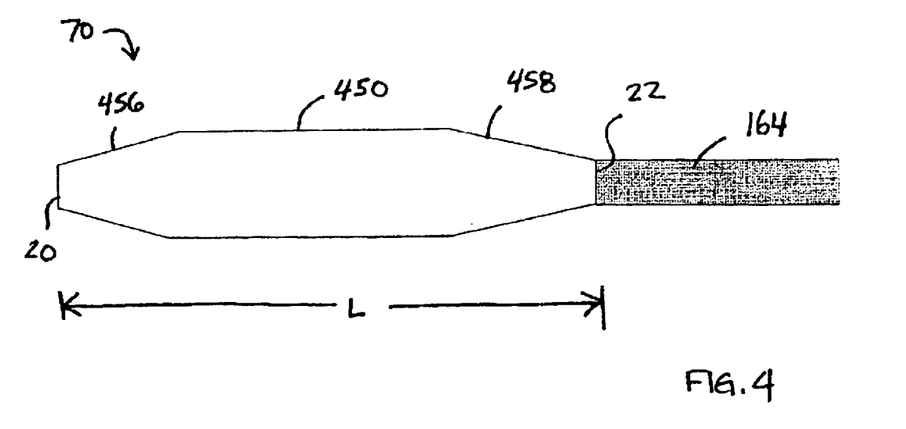
FIG. 4 is a plan view of an example gain waveguide layer for the DBR laser of FIG. 2 without an antireflection coating, wherein the gain waveguide layer has a central wide section and tapered ends.

With reference to FIG. 4, there is shown a plan view of just the gain waveguide layer 70 of gain section 10 for DBR laser 140 (FIG. 2). In this example embodiment, antireflection coating AR is absent. The width of the gain waveguide layer at the joint 22 to the tuning section is sized to match the width of waveguide layer 164 of the phase section, or alternatively the reflector section if the phase section is absent. In an example embodiment, this width is between about 1 and 1.5 microns. Further, it is desirable that the gain waveguide layer be relatively narrow at front facet 20 to obtain a good output beam shape. In an example embodiment, the width of the gain waveguide layer at the front facet is between about 1 and 1.5 microns.

Because a DBR laser without an antireflection coating has fairly even power distribution within the gain waveguide layer, the layer includes a relatively long and wide middle section 450. The gain waveguide layer also includes tapered sections 456 and 458 that form the transition between the middle section and the ends. The narrower sections of the layer serve as mode filters to ensure single transverse mode operation of the laser. In an example embodiment, middle section 450 is about 2.0 to 5 microns wide. Further in the example embodiment, the tapered sections are about 20 microns long and the overall length L of the layer is about 500 microns, so that the middle section is about 460 microns long.

DBR Laser with Antireflection Coating

Figure 5:
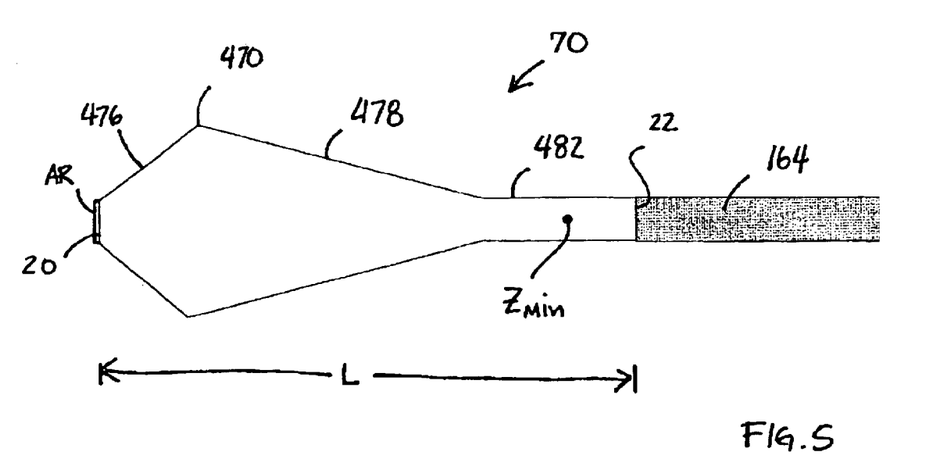
FIG. 5 is a plan view of an example gain waveguide layer for the DBR laser of FIG. 2 with an antireflection coating at the front facet, wherein the gain waveguide layer has a bulbous shape with a wide section surrounding the power maximum near the front facet and a narrow section surrounding the power minimum near the rear end of the gain section.

With reference to FIG. 5, there is shown a plan view of just the gain waveguide layer 70 of gain section 10 for DBR laser 140 (FIG. 2) with antireflection coating AR present on front facet 20. The width of the gain waveguide layer at the joint 22 to the tuning section is sized to match the width of waveguide layer 164 of the phase section or the reflector section. In an example embodiment, this width is between about 1 and 1.5 microns. Further, at front facet 20, it is desirable that the gain waveguide layer be relatively narrow to obtain a good output beam shape. In an example embodiment, the width of the gain waveguide layer at the front facet is between about 1 and 1.5 microns.

The presence of the antireflection coating significantly changes the power distribution within the gain waveguide layer. The DBR laser with an antireflection coating has a very uneven power distribution, with the power minimum location Zmin=0.93, which is very close to the joint 22 to the tuning section. The power increases by a factor of up to 5.05 times from the minimum power at a point near the front facet. Thus, the gain waveguide layer should be made wide near the front facet. However, the width of the gain waveguide layer at or very close to the front facet should be narrow to provide additional lateral mode filtering and to yield a tight output beam.

Accordingly, in the present example embodiment, the shape of the gain waveguide layer is bulbous, with a wide section 470 located close to the front facet at the location of the power maximum, and two tapered sections 476 and 478 that narrow the gain waveguide layer down to a select width at the front facet and to the width of waveguide layer 164 at the joint 22 to the tuning section. In an example embodiment, the gain waveguide layer includes a section 482 of uniform width located around the location Zmin of the power minimum $P_M$ and that connects to tapered section 478 and that extends to the joint 22 to the tuning section. Further in an example embodiment, wide section 470 has a maximum width anywhere from about 2 to about 5 microns.

GCSR Laser without Antireflection Coating

Figure 6:
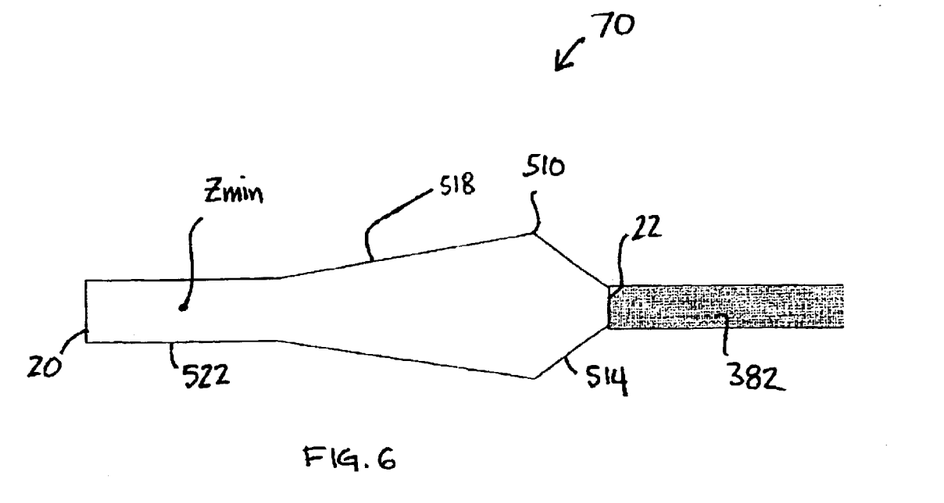
FIG. 6 is a plan view of an example gain waveguide layer for the GCSR laser of FIG. 3A without an antireflection coating, wherein the gain waveguide layer has a bulbous shape with a wide section surrounding the power maximum near the joint to the tuning section of the gain section and a narrow section surrounding the power minimum at the front facet.

With reference to FIG. 6, there is shown a plan view of just the gain waveguide layer 70 of gain section 10 for GCSR laser 300 (FIG. 3A) without antireflection coating AR. The gain waveguide layer is coupled to lower waveguide layer 382 of coupler section 306 at joint 22 to the tuning section. The width of the gain waveguide layer at the joint to the tuning section is sized to match the width of waveguide layer 382. In an example embodiment, this width is about 1 to 1.5 microns. Further, it is desirable that the gain waveguide layer be narrow at the front facet to obtain a good output beam shape. In an example embodiment, width of the gain waveguide layer at the front facet is between 1 and 1.5 microns.

The power in the gain waveguide layer is smallest near front facet 12 (Zmin/L=0.26) and is largest near joint 22 to the tuning section. This allows for the gain waveguide layer to be narrow near the front facet, which is desirable to obtain a tight output beam. However, the width of the gain waveguide layer at the joint 22 to the tuning section needs to be relatively narrow (e.g., on the order of a micron or so) to match the width of waveguide layer 384.

Accordingly, the gain waveguide layer shape is bulbous, with a wide section 510 near joint 22 to the tuning section 382. In an example embodiment, the width of the wide section is from about 2 to about 5 microns. The gain waveguide layer also includes a tapered section 514 that tapers the wide section down to the relatively narrow waveguide layer 382. Also included is a tapered section 518 that tapers the gain waveguide layer down to the narrow front facet width. In an example embodiment, tapered section 518 connects to a relatively narrow section 522 of uniform width that surrounds the position Zmin of the power minimum $P_M$. Both tapered sections 514 and 518 are gradual so that mode filtering is performed without significant loss to radiation modes (i.e., is adiabatic).

GCSR Laser with Antireflection Coating

Figure 7:
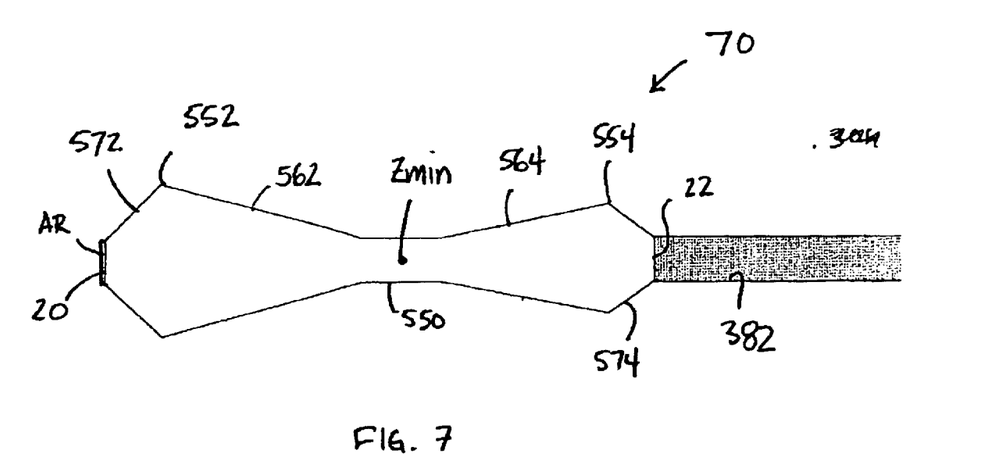
FIG. 7 is a plan view of an example gain waveguide layer for the GCSR laser of FIG. 3A with an antireflection coating, wherein the gain waveguide layer has an asymmetric butterfly shape with a central narrow section surrounding the power minimum, with a first wide section near the rear of the gain section and a second wide section near the front facet.

With reference to FIG. 7, there is shown a plan view of just the gain waveguide layer 70 of gain section 10 for GCSR laser 300 (FIG. 3A) with antireflection coating AR on front facet 20. The gain waveguide layer is coupled to lower waveguide layer 382 of coupler section 306. The width of the gain waveguide layer at the joint 22 to the tuning section is sized to match the width of waveguide layer 382. In an example embodiment, this width is about 1 to 1.5 microns. Further, it is desirable that the gain waveguide layer be narrow at the front facet to obtain a good output beam shape. In an example embodiment, width of the gain waveguide layer at the front facet is between 1 and 1.5 microns.

The presence of the antireflection coating changes the power distribution within the gain waveguide layer. The power minimum occurs at Zmin/L=0.57, which is near the middle of the gain waveguide layer. Further, near the joint 22 to the tuning section the power is relatively high (P2/Pm=2.97), while at the front facet the power is even higher (P1/Pm=5.05). Thus, the gain waveguide layer includes a narrow middle section 550 that surrounds the position Zmin of the power minimum $P_M$. On either side of the narrow middle section are wide sections 552 and 554 near the front facet 20 and joint 22 to the tuning section, respectively, that connect to the narrow middle sections via tapered sections 562 and 564. In an example embodiment, the narrow middle section has a width of about 1 to 1.5 microns. Because of the unequal power distribution, rear wide section 554 can be less wide than front wide section 552. Front wide section 552 also includes a taper 572 that narrows down to front facet 20 to a select width (e.g., 1 to 1.5 microns) to provide for a tight output beam. Likewise, rear wide section 554 includes a taper 574 that narrows down joint 22 of the tuning section to match the width of lower waveguide 382 of coupler section 306. Thus, in an example embodiment the gain waveguide layer 70 has an asymmetric butterfly shape with tapered ends. The tapered sections 562, 564, 572 and 574 are designed to perform transverse mode filtering to provide for single mode operation of the laser.

Integrated Laser Module in Optical Telecommunications

Figure 8:
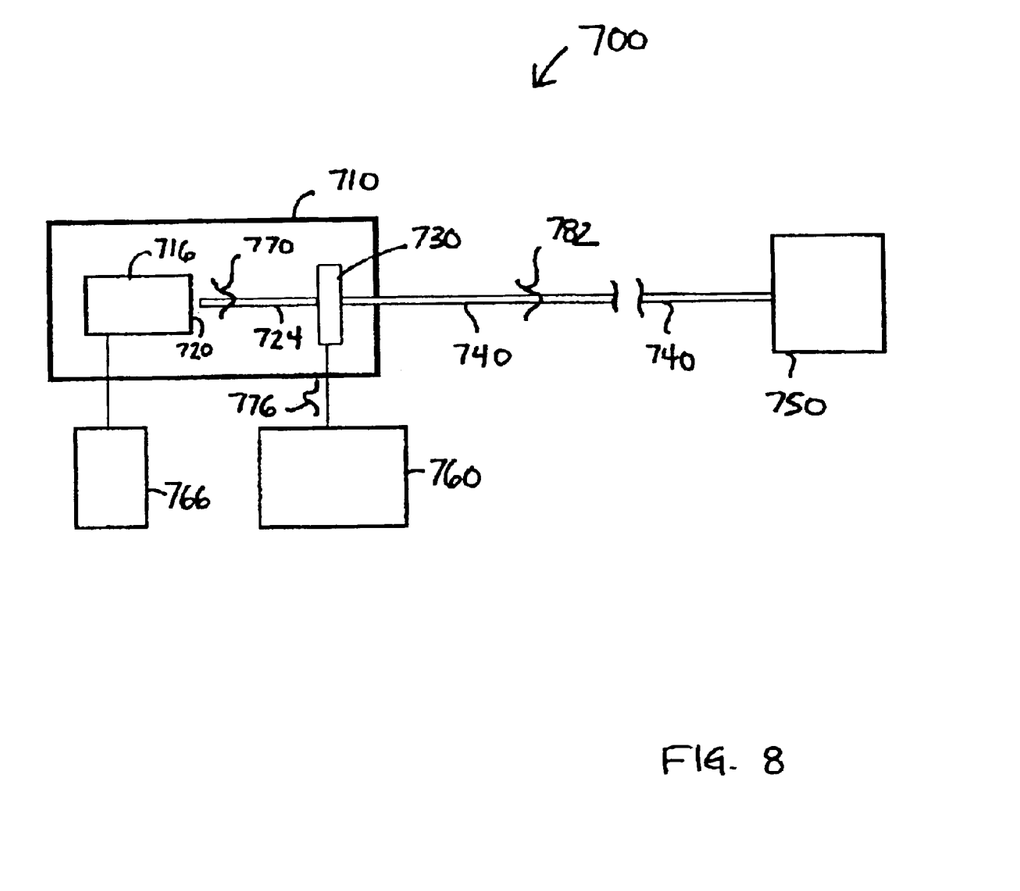
FIG. 8 is a schematic diagram of a laser modulator system as incorporated into an optical telecommunications network, with the laser modulator system including an embodiment of an integrated module.

With reference now to FIG. 8, there is shown a portion of an optical fiber telecommunications network 700 that includes a laser modulation system 710 as a light source. System 710 includes an integrated laser module 716 with an output end 720, such as module 230 or module 398, discussed above. System 710 also includes a first length of optical fiber 724 coupled at one end to output end 720 and at the other end to a modulator 730. A second length of optical fiber 740 is coupled at one end to the modulator and at its other end to a fiber optical network 750.

An electronic device 760 is connected to modulator 730, and a power supply 766 is connected to integrated laser module 716. The power supply provides power to the integrated laser module, allowing it to output a DC light beam 770 into optical fiber section 724. Electronic device 760 sends an electronic signal 776 to modulator 730 to drive the modulator in order to modulate the DC light beam passing therethrough. The result is a modulated light beam 782 that travels down optical fiber 740 and into fiber optical network 750.

As discussed above, the frequency of the light emitted by the integrated laser module is tunable, thereby providing the capability for generating optical signals with different frequencies, making the module applicable to dense wavelength division multiplexing (DWDM) applications.

While the present invention has been described in connection with preferred embodiments, it will be understood that it is not so limited. On the contrary, it is intended to cover all alternatives, modifications and equivalents as may be included within the spirit and scope of the invention as defined in the appended claims.

What is claimed is:

1. A semiconductor laser comprising:
   a tuning section with a waveguide layer having a first width;
   a gain section with a gain waveguide layer having a front facet and a rear end that define a laser cavity, the gain section coupled to the waveguide layer of the tuning section at the rear end to form a joint to the tuning section, the gain waveguide layer formed on a mesa between a layer of n-doped indium phosphide (n-InP) and a layer of p-doped indium phosphide (p-InP);
   a varying power distribution within the gain waveguide layer; and
   wherein the width of the gain waveguide layer corresponds to the distribution of power and matches the width of the tuning section waveguide layer at the joint to the tuning section and matches a select width at the front facet.

2. The laser of claim 1, wherein:
   the tuning section includes a phase section and a reflector section; and
   wherein the gain waveguide layer has a uniformly wide middle section surrounded by first and second tapered sections that narrow towards the front facet and rear end of the gain section, respectively.

3. The laser of claim 2, wherein the laser has an output of about 20 mW.

4. The laser of claim 1, wherein:
   the tuning section includes a phase section and a reflector section;
   the front facet includes an antireflection coating; and
   wherein the gain waveguide layer has a bulbous shape with a maximum width near the front facet, a first tapered section that narrows from the maximum width to the select front facet width, and a second tapered section that narrows to the width of the tuning section waveguide.

5. The laser of claim 4, wherein the laser has an output of about 30 mW.

6. The laser of claim 1, wherein:
   the tuning section includes a coupler section, and a reflector section having a sampled reflector grating; and
   wherein the gain waveguide layer has a bulbous shape with a maximum width near the rear end, a first tapered section that narrows from the maximum width to the select front facet width, and a second tapered section that narrows to the width of the tuning section waveguide.

7. The laser of claim 6, wherein the laser has an output of between 5 and 10 mW.

8. The laser of claim 1, wherein:
   the tuning section includes a coupler section, and a reflector section having a sampled reflector grating;
   an antireflection coating on the front facet; and wherein the gain waveguide layer has a narrow width near the center surrounding a power minimum, a first bulbous section with a first maximum width that tapers to the select front facet width, and a second bulbous section with a second maximum width that tapers down to the width of the tuning section waveguide layer.

9. The laser of claim 8, wherein the laser has an output of between 10 and 20 mW.

10. The laser of claim 8, wherein the first maximum width is greater than the second maximum width.

11. The laser of claim 1, wherein the gain waveguide layer has a maximum width of 5 microns or less.

12. The laser of claim 1, wherein the laser has an output beam having a wavelength in the range from 1.5 to 1.62 microns.

13. A laser module comprising:
a semiconductor laser having a tuning section that includes a phase section and a reflector section and a waveguide layer having a first width, a gain section with a gain layer having a front facet and a rear end that define a laser cavity, the gain layer coupled to the waveguide layer of the tuning section at the rear end to form a joint to the tuning section rear end, wherein the gain layer is formed on a mesa between a layer of n-doped indium phosphide (n-InP) and a layer of p-doped indium phosphide (p-InP);
a varying power distribution within the gain waveguide layer, wherein the width of the gain waveguide layer corresponds to the distribution of power and matches the width of the tuning section waveguide layer at the joint to the tuning section;
first, second and third current sources electrically connected to the gain section, phase section and reflector section, respectively; and
a programmable controller connected to the first, second and third current sources and programmed to control the current sources to deliver select amounts of current to the respective sections.

14. The laser module of claim 13, wherein:
the tuning section further includes a coupler section between the gain section and the phase section that serves as a frequency filter; and
a fourth current source operatively connected to the coupler section and to the programmable controller.

15. The laser module of claim 13 or 14, wherein the programmable controller includes a look-up table that associates current values with output frequency values.

16. The laser module of claim 13 or 14, wherein the programmable controller includes a microprocessor.

17. The laser module of claim 13 or 14, further including a power supply connected to the programmable controller.

18. The laser module of claim 13, further including:
a modulator arranged adjacent the front facet and in the path of an output beam; and
an electronic device connected to the modulator and adapted to drive the modulator to provide for a modulated output beam.

19. The laser module of claim 18, further including:
a first length of optical fiber having a first end coupled to the front facet and a second end coupled to the modulator.

20. The laser module of claim 19, further including a second length of optical fiber coupled having a first end coupled to the modulator and a second end coupled to a fiber optical network.

21. A distributed Bragg reflector (DBR) semiconductor laser, comprising:
a reflector section containing a first portion of a tunable waveguide layer with a periodic grating adjacent the tunable waveguide;
a phase section adjoining the reflector section and containing a second portion of the tunable waveguide including a first end having a first width;
a gain section adjoining the phase section and having a gain waveguide layer coupled to the first end of the tunable waveguide layer, the gain waveguide layer having a front facet, a rear end serving as a joint to the tuning section, and a width that varies in proportion to a power distribution within the gain waveguide layer.

22. The laser of claim 21, wherein the front facet has a width of between 1 and 2 microns, and the gain waveguide layer includes a uniformly wide middle section that tapers down to the front facet and to the joint to the tuning section.

23. The laser of claim 21, wherein the front facet includes an antireflection coating, and the gain waveguide layer has a bulbous shape with a maximum width near the front facet, a first tapered section that narrows from the maximum width to the front facet and a second tapered section that narrows to the width of the tunable waveguide layer.

24. The laser of claim 20, further including:
a first current source connected to the reflector section at a first upper contact;
a second current source connected to the phase section at a second upper contact;
a third current source connected to the gain section at a third upper contact; and
a programmable controller connected to each current source and programmed to deliver current to produce an output beam of a select frequency.

25. The laser of claim 24, wherein the programmable controller includes a look-up table that associates current values with output frequency values.

* * * * *

UNITED STATES PATENT AND TRADEMARK OFFICE
CERTIFICATE OF CORRECTION

PATENT NO. : 6,810,058 B2
DATED : October 26, 2004
INVENTOR(S) : Wesstrom

It is certified that error appears in the above-identified patent and that said Letters Patent is hereby corrected as shown below:

Title page,
Item [56], References Cited, OTHER PUBLICATIONS,
"Jayaraman" reference, delete "continous" and insert -- continuous --, therefor.

Column 3,
Line 32, after "26" insert -- is --.

Column 4,
Line 52, delete "look" and insert -- look-up table that --, therefor.

Column 7,
Line 31, delete "P2/P$_M$" and insert -- P$_2$/P$_M$ --, therefor.
Line 31, delete "Pav/P$_M$" and insert -- P$_{av}$/P$_M$ --, therefor.

Signed and Sealed this

Fifth Day of April, 2005

JON W. DUDAS
*Director of the United States Patent and Trademark Office*